United States Patent
Guo et al.

(10) Patent No.: US 9,571,765 B2
(45) Date of Patent: Feb. 14, 2017

(54) UNIVERSAL FOUR-SIDE BUTTABLE DIGITAL CMOS IMAGER

(71) Applicant: General Electric Company, Schenectady, NY (US)

(72) Inventors: Jianjun Guo, Ballston Spa, NY (US); Brian David Yanoff, Niskayuna, NY (US); Jonathan David Short, Niskayuna, NY (US); Biju Jacob, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 47 days.

(21) Appl. No.: 14/750,067

(22) Filed: Jun. 25, 2015

(65) Prior Publication Data

US 2016/0381311 A1 Dec. 29, 2016

(51) Int. Cl.
*H04N 5/335* (2011.01)
*H04N 5/369* (2011.01)
*H04N 5/378* (2011.01)

(52) U.S. Cl.
CPC .............. *H04N 5/369* (2013.01); *H04N 5/378* (2013.01)

(58) Field of Classification Search
CPC ......... H04N 5/369; H04N 5/378; H04N 5/335
USPC ................................ 348/294, 308; 250/208.1
See application file for complete search history.

(56) References Cited

U.S. PATENT DOCUMENTS

| | | |
|---|---|---|
| 5,336,879 A | 8/1994 | Sauer |
| 5,464,984 A | 11/1995 | Cox et al. |
| 5,886,353 A | 3/1999 | Spivey et al. |

(Continued)

FOREIGN PATENT DOCUMENTS

WO 2014072939 A1 5/2014

OTHER PUBLICATIONS

O. Lilmousin et al., "Caliste 256: A CdTe imaging spectrometer for space science with a 580 μm pixel pitch", Nuclear Instruments and Methods in Physics Research Section A: Accelerators, Spectrometers, Detectors and Associated Equipment, ScienceDirect, vol. 647, Issue 1, Aug. 11, 2011, DOI: 10.1016/j.nima.2011.05.011, (pp. 46-54, 9 total pages).

(Continued)

*Primary Examiner* — Sinh Tran
*Assistant Examiner* — Zhenzhen Wu
(74) *Attorney, Agent, or Firm* — Melissa K. Dobson

(57) ABSTRACT

An imager including sub-imager pixel arrays having a plurality of four-side buttable imagers distributed on a substrate and an on-chip digitizing readout circuit. Pixel groupings formed from among the plurality of four-side buttable imagers. The readout electronics including a buffer amplifier for each of the pixel groupings and connected to respective outputs of each four-side buttable imager of the pixel grouping. A plurality of shared analog front ends, each shared analog front end connected to respective multiple buffer amplifiers from among the plurality of pixel groupings. An analog-to-digital converter located at a common centroid location relative to the plurality of shared analog front ends, the analog-to-digital converter having a fully addressable input selection to individually select an output from each of the plurality of shared analog front ends. An output of the analog-to-digital converter connected to a trace on a back surface of the wafer substrate by a through-substrate-via.

15 Claims, 7 Drawing Sheets

(56) References Cited

U.S. PATENT DOCUMENTS

| | | | |
|---|---|---|---|
| 7,009,646 B1 * | 3/2006 | Fossum | H01L 27/14601 257/E27.133 |
| 7,606,346 B2 | 10/2009 | Tkaczyk et al. | |
| 8,188,417 B2 | 5/2012 | Kobayashi et al. | |
| 8,850,697 B2 | 10/2014 | Spartiotis et al. | |
| 2006/0192087 A1 | 8/2006 | Kuszpet et al. | |
| 2013/0321685 A1 * | 12/2013 | Ahn | H04N 5/374 348/308 |
| 2015/0288908 A1 * | 10/2015 | Shen | G06F 17/5072 348/308 |
| 2016/0118424 A1 * | 4/2016 | Guidash | H01L 27/14614 250/208.1 |

OTHER PUBLICATIONS

Henry, D. et al., "TSV Last for Hybrid Pixel Detectors: Application to Particle Physics and Imaging Experiments", 2013 Electronic Components and Technology Conference (ECTC), Las Vegas, NV, IEEE Xplore, May 28-31, 2013, (pp. 568-575, 8 total pages).

* cited by examiner

UNIVERSAL FOUR-SIDE BUTTABLE DIGITAL CMOS IMAGER

BACKGROUND

CMOS image sensors can be integrated with all kinds of functional circuitry and blocks in a single chip. A digital imager typically can include a photodiode array, column readout structure, A/D conversion, and digital controllers (or processors) on single or multiple substrates. In a conventional front-side illuminated (FSI) imager, incident photons first cross metal connection layers before reaching the photodiodes, causing a portion of the incident photons to be reflected away from the photodiodes. Conventional back-side illuminated (BSI) imager can divide the photodiode and circuitry into different strata, providing photons to the photodiodes directly from the other side of the substrate.

FIG. 1 depicts conventional four-side buttable BSI imager 100 using multiple layers of chips stacked in a three-dimensional (3D) package. On a first layer, the 3D BSI imager includes imaging sensor array 110 with pixels containing photodiodes that are exposed to incident light. Traces 120 route the pixel output(s) to layers of silicon stack 130. The silicon stack can include top and bottom aluminum nitride substrates 132, 133. Between the AlN caps can be rerouting interposer 134 along with analog-digital converter (ADC) master control chip 136 and ADC slave control chip 137. System interface 140 can be connected to BSI imager 100 via spring-loaded (POGO) pins 145.

DESCRIPTION

In accordance with embodiments, a four-side buttable complementary metal oxide semiconductor (CMOS) imager includes readout electronics distributed on-wafer among the array of photodiode pixels. Embodying imagers can be butted against other imagers on all four sides. Conventional imagers are buttable only along three sides because they include an electronics channel along a fourth side adjacent to the pixel array. Conventional four-side buttable imagers employs complicated and expensive 3D packaging technology to stack the image sensor, analog and digital readout electronics in a multi-layer structure. Embodying imagers provide large-area sensors from multiple sub-imagers butted together.

In accordance with embodiments, pixels formed by grouping these imagers can include on-chip digitizing with simplified electronic design. Embodying sub-imagers are fully addressable providing an ability to bin multiple pixel outputs outside a region-of-interest (ROI), while reading full image data from pixels within the ROI. Binning a pixel is the ability to combine signals from multiple pixels and treat the result as the signal from one larger pixel.

Figure 1:
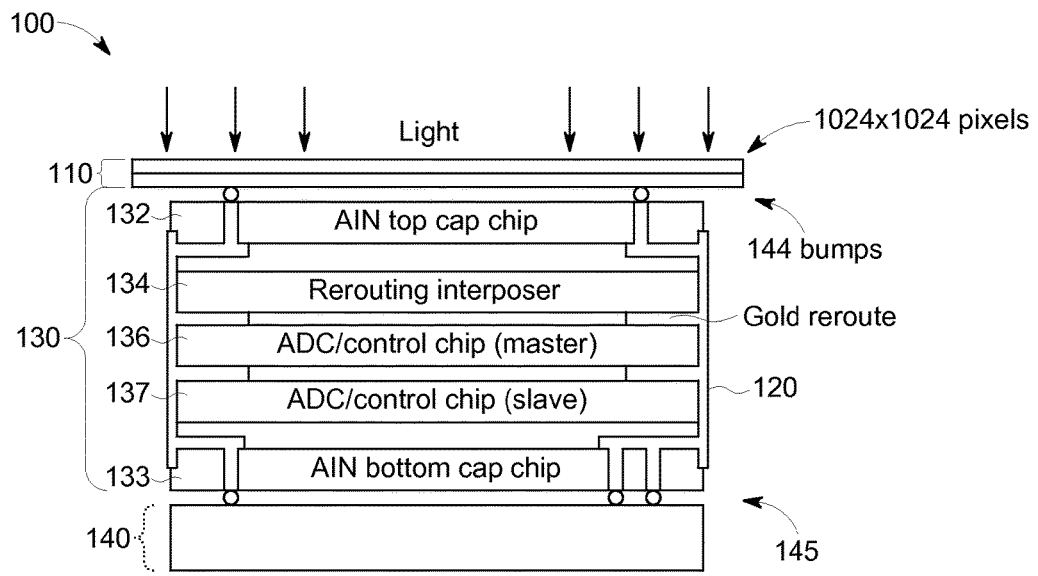
FIG. 1 depicts a conventional BSI 4-side buttable imager.
Figure 2:
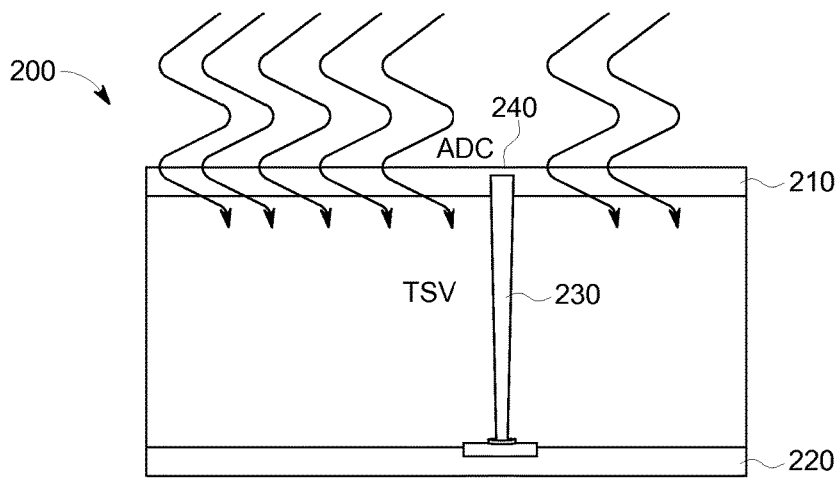
FIG. 2 depicts an imager in accordance with embodiments.

FIG. 2 depicts four-side buttable CMOS imager pixel 200 in accordance with embodiments. Imager 200 includes photodiode 210 exposed to incident photons. Imager 200 includes on-chip electronics 240 that digitize the photodiode output—for example, an ADC is shown. The on-wafer electronics provide a digital multiplexed output connected by through-substrate-via (TSV) 230 to PCB 220. Imager 200 is depicted as an FSI imager, but embodiments are not so limited. BSI imagers with readout electronics distributed on-wafer among the array of photodiode pixels is within the scope of this disclosure.

Locating the on-wafer electronics close to the photodiode provides lower noise (greater S/N than conventional approaches). Traces interconnecting the photodiode to the electronics, and the traces interconnecting the on-wafer electronic components both can have shorter length than conventional approaches. Decreased trace length results directly in lower power requirements for on-board amplifiers, since there is not a need to drive the signal across long data lines. These lower power requirements yield smaller imagers that can operate at faster speeds.

Figure 3:
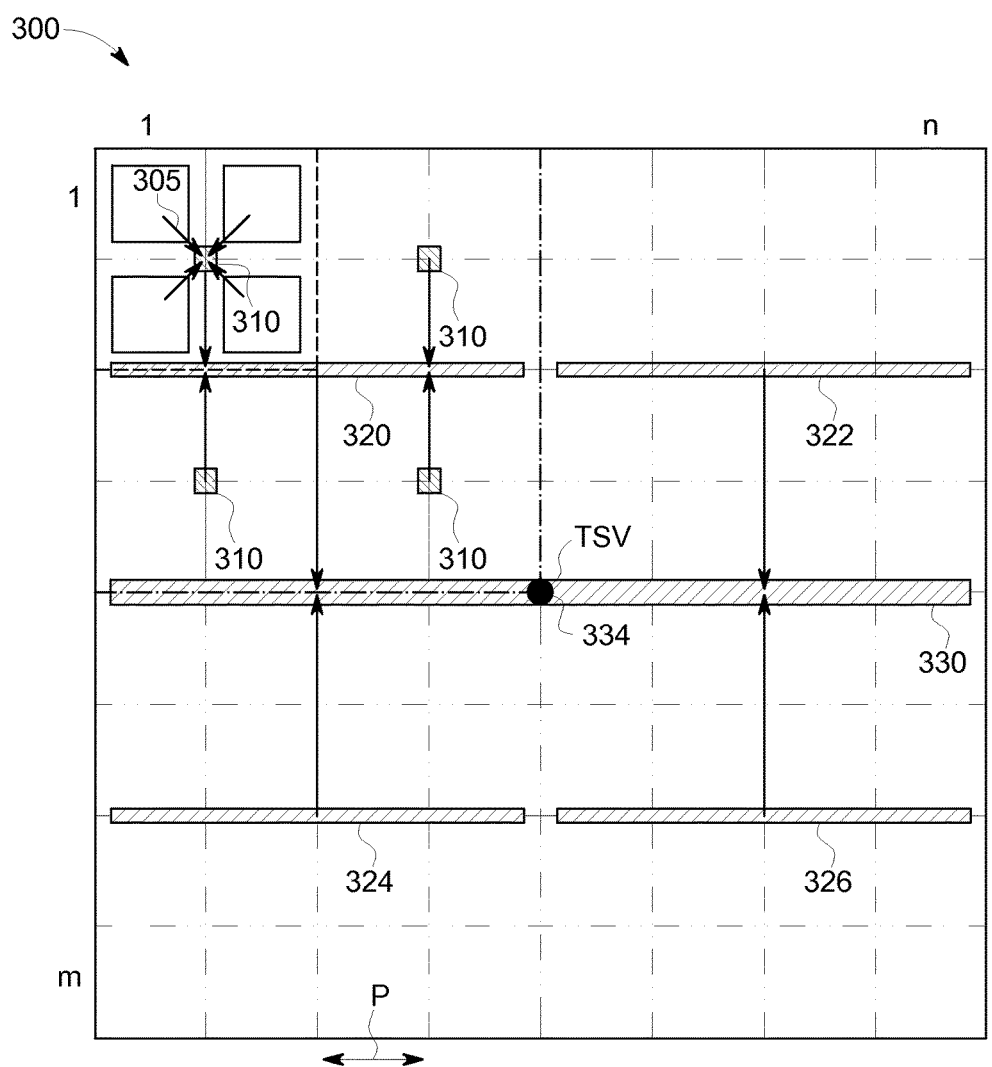
FIG. 3 depicts a sub-imager pixel array in accordance with embodiments.

FIG. 3 depicts sub-imager pixel array 300 formed from combining multiple imager pixels P in accordance with embodiments. For example, the depicted array is a m×n array of imager pixels where m=n=8 in this instance for purposes of discussion. However, embodiments are not so limited and m and n can be other predetermined numbers that can be independent of each other.

In accordance with embodiments, the outputs of multiple pixels can be grouped together. By way of example, sub-imager pixel array 300 is depicted as having groupings of four pixels. Each of the pixel groupings shares its own respective buffer amplifier 310. Each pixel output of the group is connected to its respective amplifier by respective trace 305, which is positioned symmetrically with respect to each of the group's pixels.

The amplifier is located in the pixel grouping at a common centroid layout to improve uniformity in the length and positioning of trace 305. The amplifier can include multiplexed addressable inputs so that the output of each pixel is individually selectable.

Multiple amplifiers are grouped together by connection to shared analog front end 320, 322, 324, 326. Each shared analog front end 320, 322, 324, 326 is at a common centroid location relative to its connected respective amplifiers to equalize trace path lengths and bends between each respective amplifier to its connected analog front end.

In accordance with embodiments, each sub-imager pixel array can include ADC 330 located at common centroid location relative to the shared analog front ends. In accordance with embodiments, the sub-imager can have more than one ADC. The ADC provides shared digital output 334 for the sub-imager. In accordance with embodiments, the ADC digital output is connected to a trace on the sub-imager backside by a TSV. The ADC has fully addressable inputs so that each of its input signals provided by respective shared analog front end 320, 322, 324, 326 are individually selectable.

In accordance with embodiments, the readout electronics disclosed above (i.e., buffer amplifier 310, analog front end 320, 322, 324, 326, and ADC 330) are distributed on-wafer among the pixels of pixel array 300.

In accordance with embodiments, sub-imager pixel array can accommodate binning at the lowest level. As noted above, the input to shared amplifier 310 is addressable.

Further, binning at a 2×2 level of pixels can be achieved by selectively addressing the inputs to each of the shared analog front end 320, 322, 324, 326. By selectively addressing the inputs to ADC 330, 4×4 binning can be achieved. Binning of an embodying sub-imager pixel array can be performed in both row and column directions because of the fully addressable configuration of the electronics. In particular, because binning of embodying sub-imager pixel array can be performed at the analog level, the noise penalty of binning at the digital level is eliminated.

Because the level of binning can be selectively achieved from the lowest to highest resolutions, the ROI is fully addressable. Scan time can be decreased by minimizing data acquisition outside the ROI region. For example, every tenth data frame could be fully read from each imager, otherwise binning can be performed outside the ROI during the other frames. Such implementation of binning made possible by embodying imagers results in the ROI having the highest resolution image, while areas outside the ROI have a lower resolution image.

Figure 4:
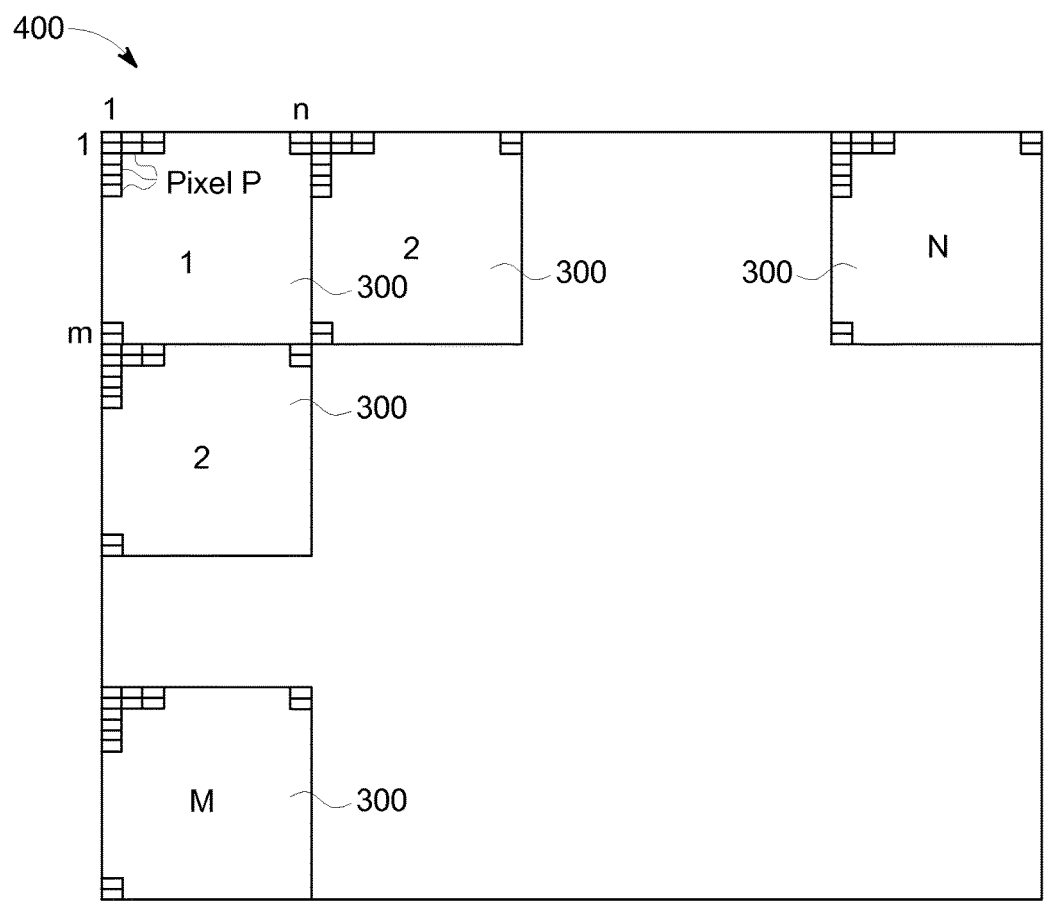
FIG. 4 depicts an imager tile in accordance with embodiments.

FIG. 4 depicts imager tile 400 formed from an M×N array of sub-imager pixel arrays 300 in accordance with embodiments. As disclosed above, each sub-imager pixel array is an m×n array of pixels having sub-imager readout electronics on-wafer among the array of photodiode pixels (where, for example, m=n=8).

Based on current CMOS wafer fabrication technology, for a pixel size of 50 micron×50 micron, and a sub-imager array where m=n=8, the largest embodying imager tile 400 that can be produced without stitching is M×N=60×80 (i.e., 2.4 cm×3.2 cm). However, embodying imagers are not so limited and other sizes can be produced should wafer fabrication technology permit.

The values for the number of rows and columns M×N can be selected based on the application size of the imager tile, where the predetermined numbers for M and N can be independent of each other. Multiple imager tiles 400 can be butted together to form the imager based on its use. The size of the imager formed from multiple imager tiles 400 is dependent on the application of the imager.

Table I illustrates values of K×L for imagers of different applications using a imager tiles 400. These values are representative of the different size imagers that can be developed using embodying 4-side buttable CMOS imagers as disclosed herein. As presented in Table I, imagers can be assembled from embodying imagers with applications in mammography, cardiac surgery, large or small interventional surgery, and radiation therapy uses.

TABLE I

| K | L | Length (cm) | Width (cm) | Application |
|---|---|---|---|---|
| 10 | 10 | 24 | 32 | Mammography |
| 9 | 7 | 21 | 22 | Surgery, Cardiology |
| 13 | 10 | 31 | 32 | Surgery, Interventional |
| 17 | 13 | 41 | 42 | Radiology, Interventional |

Figure 5A:
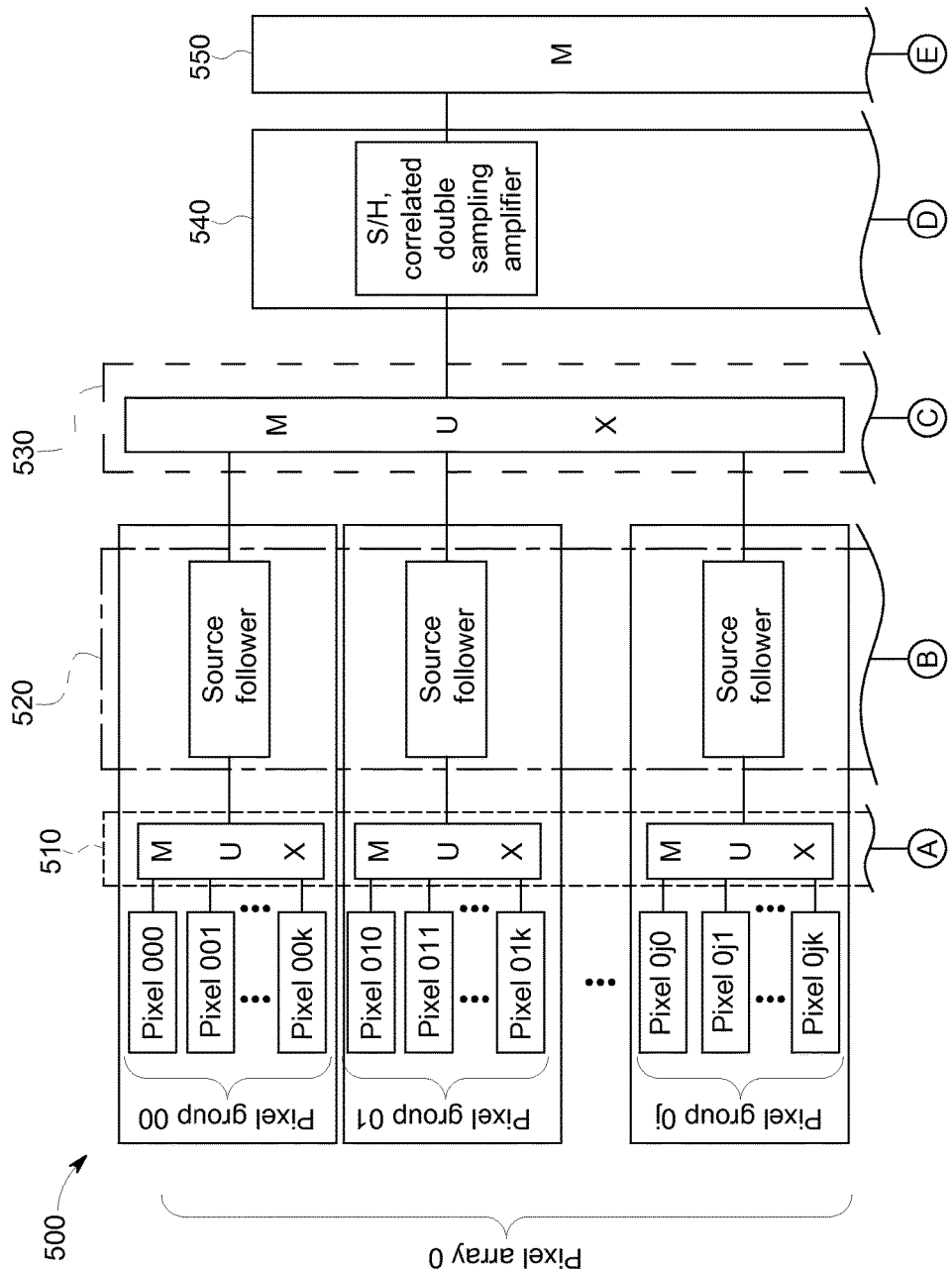
FIGS. 5A-5C depict a general architecture of the sub-imager having an m×n pixel array of FIG. 3 in accordance with embodiments.
Figure 5B:
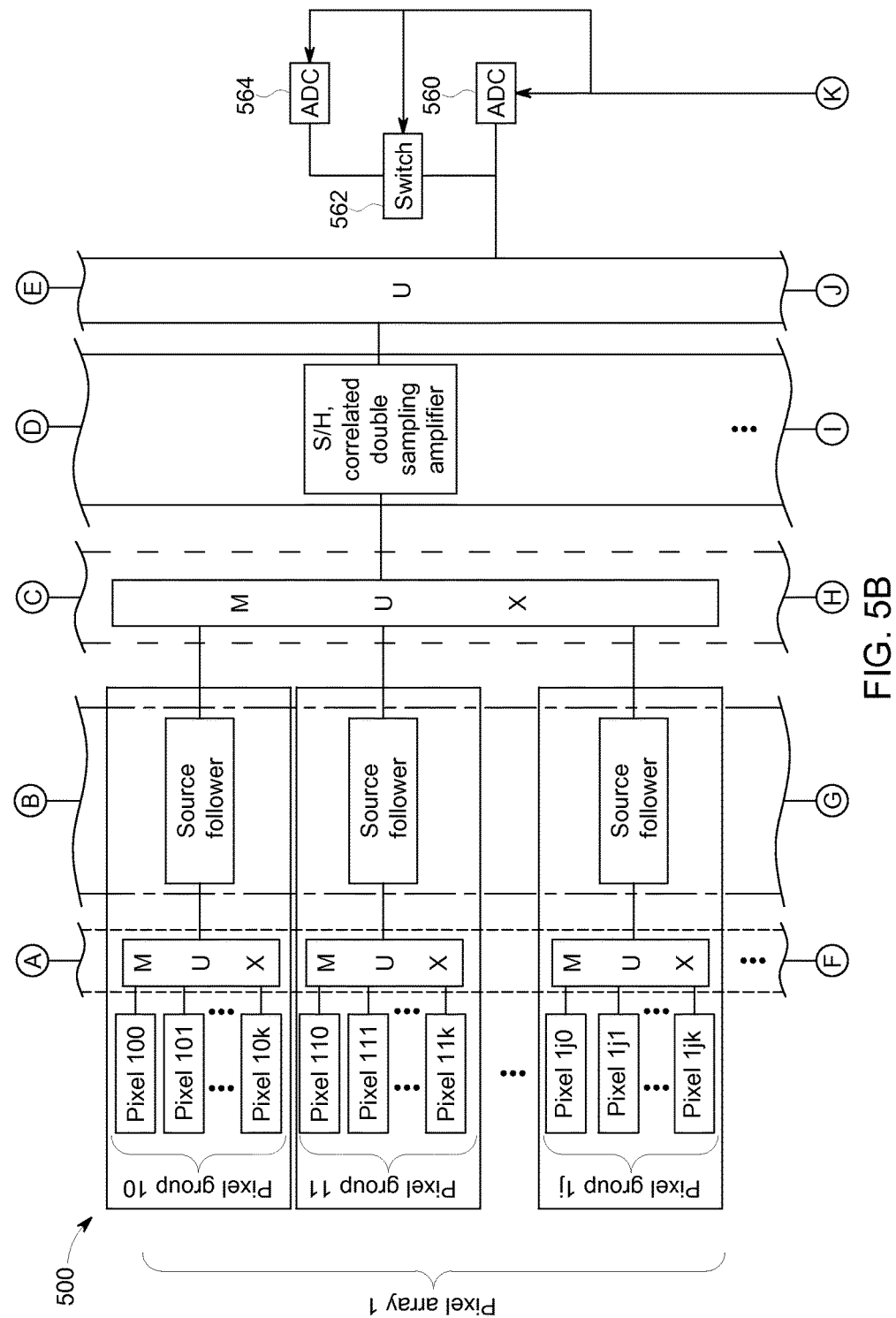
Figure 5C:
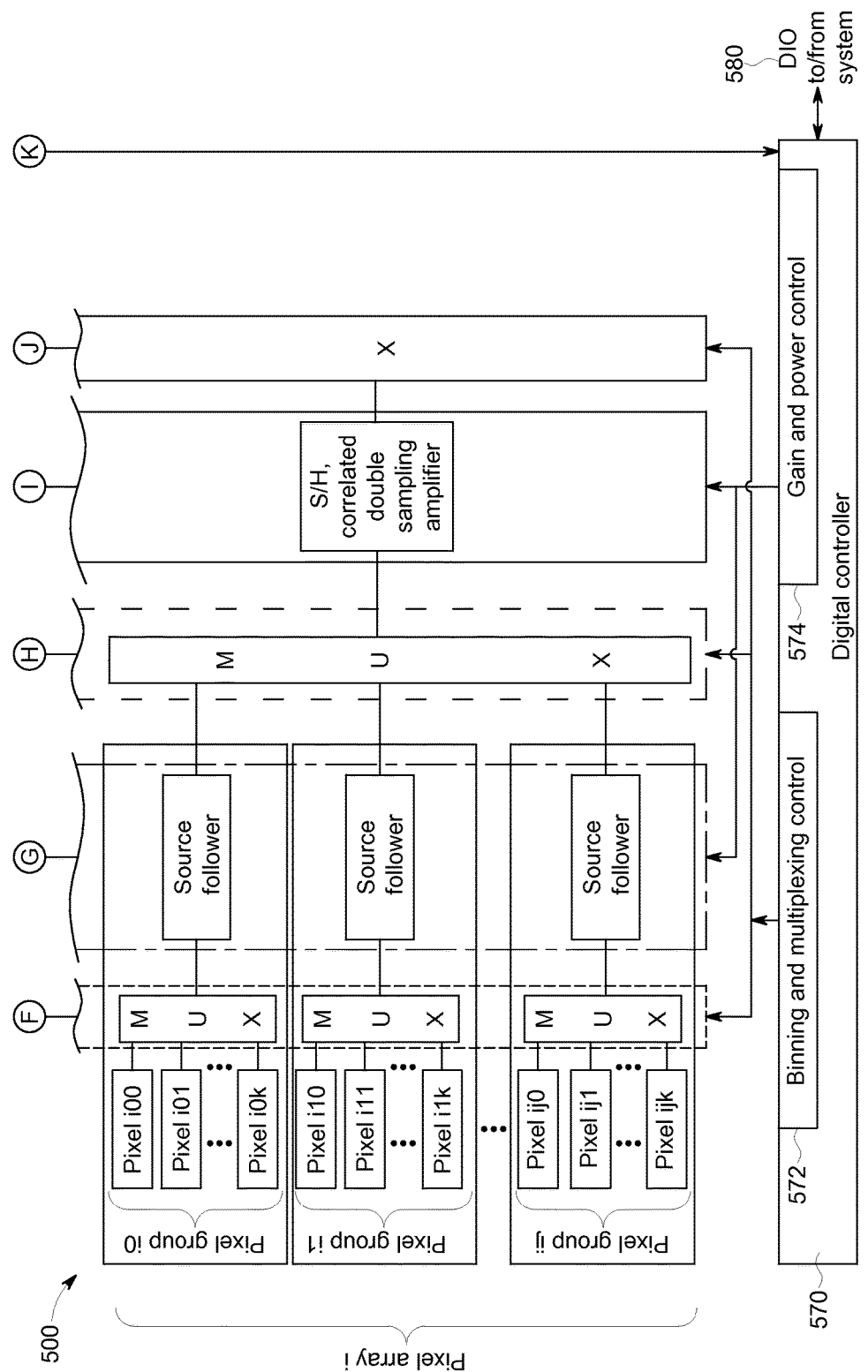

FIGS. 5A-5C depict general architecture 500 of m×n sub-imager pixel array 300 in accordance with embodiments. The general architecture of the sub-imager pixel array includes pixels 000, 001, . . . , 00k forming pixel groups 00, 01, 0i. Each output of individual pixels is selectable by respective first stage multiplexer (MUX) 510. The selected pixel output is provided to respective pixel group amplifier 520, which in accordance with some implementations can be a source follower amplifier. The output of each amplifier is provided to respective second stage MUX 530. The inputs from the respective shared amplifiers are selectable by MUX 530 as input to the shared analog front end amplifier 540, which in accordance with some implementations can be a sample/hold correlated double-sampling amplifier. The output or each respective shared amplifier is provided to third stage MUX 550. The third stage MUX selects which amplifier output(s) is provided as input to ADC 560.

Digital controller 570 provides control signals to MUX 510, 530, 550, respective amplifiers 520, respective front end amplifiers 540, and ADC 560. Digital controller 570 includes binning/multiplex control stage 572 and amplifier gain/power control stage 574. The digital controller can communicate with a scanner control unit (not shown) via digital input/output interface 580.

Figure 6:
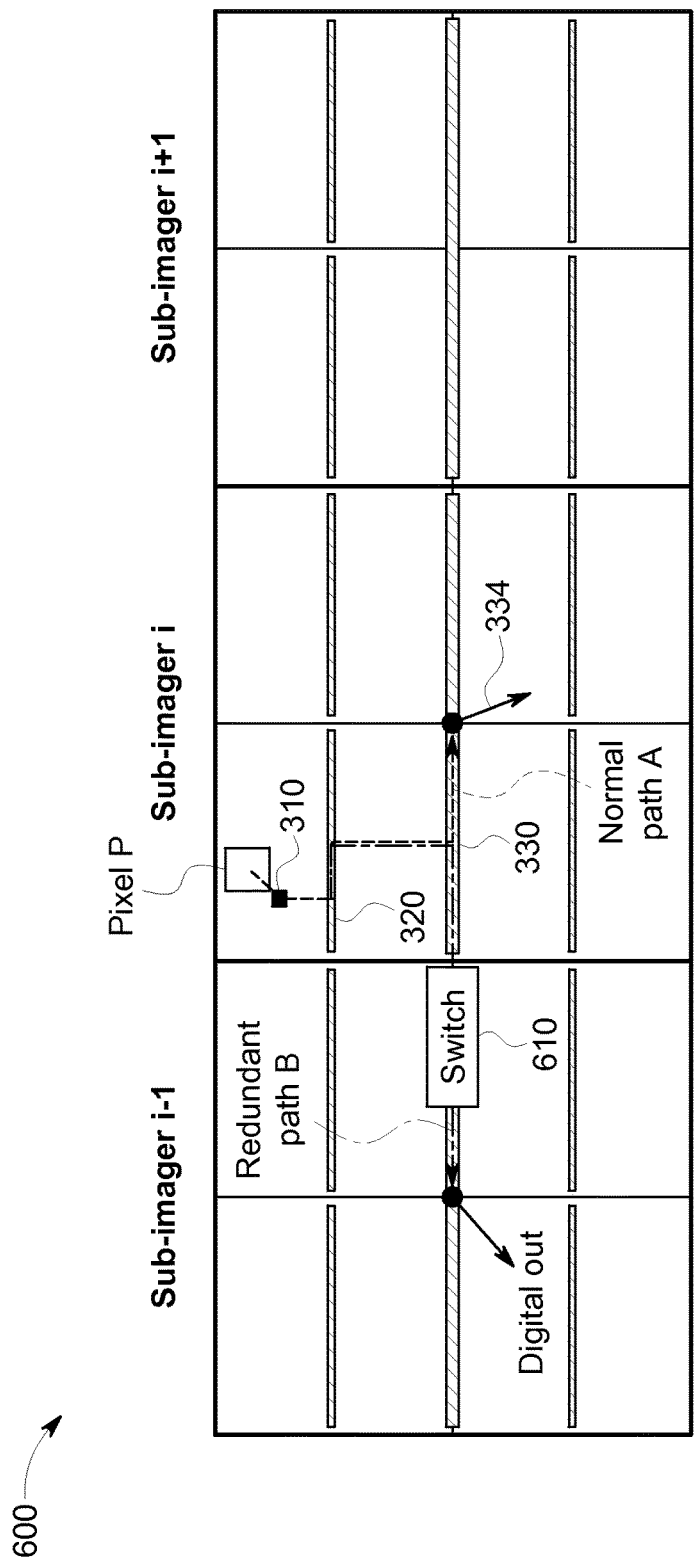
FIG. 6 depicts a portion of the imager tile of FIG. 4 in accordance with embodiments.

FIG. 6 depicts imager tile portion 600 of imager tile 400 in accordance with embodiments. The depicted portion includes sub-imager i, and two adjacent sub-imagers i−1, i+1. Each of these sub-imagers is a sub-imager pixel array and includes Pixel P providing its output to buffer amplifier 310 which is connected to shared analog front end 320 connected to ADC 330 in accordance with embodiments described above. The output of ADC 330 is sub-imager digital output 334 connected to the sub-imager backside by a TSV. This output signal flow is illustrated as Normal Path A in FIG. 6. Fabrication errors can result in a failure to read the sub-imager digital output at the port on the backside of the sub-imager. For example, fabrication errors can include semiconductor yield failures and/or mechanical connection to the pick-up port. In accordance with implementations, the signal of sub-imager i can follow Redundant Output Path B by control of switch 610 located in an adjacent sub-imager pixel array. The timing to read the output of sub-imager i at the output of sub-imager i−1 can be controlled by digital controller 580. In another implementation where digital output 334 can be read, redundant ADC 564 (FIG. 5B) can be accessed under control of digital controller 580 when switch 562 is closed. In this implementation, a fabrication error that corrupted the sub-imager's ADC can be overcome by accessing the redundant ADC.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. An imager tile comprising:
   an array of sub-imager pixel arrays, the sub-imager pixel arrays arranged in rows and columns;
   each of the sub-imager pixel arrays including a plurality of four-side buttable imagers distributed on a wafer substrate and an on-chip digitizing electronic readout circuit;
   each of the four-side buttable imagers including at least one photodiode configured to be exposed to incident photon radiation;
   a plurality of pixel groupings formed from among the plurality of imagers;

the readout electronics including a buffer amplifier for each of the plurality of pixel groupings and connected to respective outputs of each four-side buttable imager of the pixel grouping;
a plurality of shared analog front ends, each shared analog front end connected to respective multiple buffer amplifiers from among the plurality of pixel groupings;
an analog-to-digital converter located at a common centroid location relative to the plurality of shared analog front ends, the analog-to-digital converter having a fully addressable input selection to individually select an output from each of the plurality of shared analog front ends; and
an output of the analog-to-digital converter connected to a trace on a back surface of the wafer substrate by a through-substrate-via.

2. The imager tile of claim 1, including each of the four-side buttable imager pixels having a printed circuit board connected to an output of the on-chip digitizing electronic circuit by a through-substrate-via.

3. The imager tile of claim 1, the buffer amplifier located at a centroid common to each four-side buttable imager pixel of the pixel grouping.

4. The imager tile of claim 3, including a respective circuit trace symmetrically located from each four-side buttable imager pixel of the pixel grouping to an input of the buffer amplifier.

5. The imager tile of claim 1, including each respective buffer amplifier having a multiplexed addressable input for each four-side buttable imager pixel of the pixel grouping.

6. The imager tile of claim 1, including each shared analog front end located at a centroid common to each of the pixel groupings connected to respective shared analog front ends.

7. The imager tile of claim 1, including:
a redundant output path connecting a first one of the sub-imager pixel arrays to an adjacent one of the sub-imager pixel arrays; and
a control switch configured to close the redundant output path under control of a digital controller.

8. The imager tile of claim 1, including each respective on-chip digitizing electronic circuit configured to provide a digital signal proportionate to an output of a respective photodiode.

9. The imager tile of claim 8, wherein the on-chip digitizing electronic circuit is an analog-to-digital converter.

10. The imager tile of claim 1, including:
a first predetermined number of the sub-imager pixel arrays arranged in the rows;
a second predetermined number of the sub-imager pixel arrays arranged in the columns; and
the first predetermined number and the second predetermined number based on a size of the imager tile needed for a particular imaging application.

11. A semiconductor imager comprising:
a plurality of four-side buttable imager pixels each including a photodiode configured to be exposed to incident photon radiation;
a plurality of pixel groupings formed from among the plurality of four-side buttable imager pixels, each of the pixel groupings including a buffer amplifier connected to respective outputs of each four-side buttable imager pixel of the pixel grouping;
each buffer amplifier located at a common centroid location relative to respective four-side buttable imager pixels of respective pixel groupings;
an array of sub-imager pixel arrays formed from among the plurality of pixel groupings, the sub-imager pixels arrays arranged in rows and columns;
a plurality of shared analog front ends, each shared analog front end connected to respective multiple buffer amplifiers from among the plurality of pixel groupings;
each shared analog front end located at a common centroid location relative to respective pixel groupings of respective sub-imager pixel arrays;
an analog-to-digital converter located at a common centroid location relative to the plurality of shared analog front ends, the analog-to-digital converter having a fully addressable input selection to individually select an output from each of the plurality of shared analog front ends; and
an output of the analog-to-digital converter connected to a trace on a back surface of the wafer substrate by a through silicon via.

12. The semiconductor imager of claim 11, including a respective circuit trace symmetrically located from each four-side buttable imager pixel of a respective pixel grouping to an input of a respective buffer amplifier.

13. The semiconductor imager of claim 11, including each respective buffer amplifier having a multiplexed addressable input for each four-side buttable imager pixel of the pixel grouping.

14. The semiconductor imager of claim 11, including:
a redundant output path connecting a first one of the sub-imager pixel arrays to an adjacent one of the sub-imager pixel arrays; and
a control switch configured to close the redundant output path under control of a digital controller.

15. The semiconductor imager of claim 11, including:
a first predetermined number of the sub-imager pixel arrays arranged in the rows;
a second predetermined number of the sub-imager pixel arrays arranged in the columns; and
the first predetermined number and the second predetermined number based on a size of an imager tile needed for a particular imaging application.

* * * * *